United States Patent
Chen (10) Patent No.: US 11,503,241 B2
(45) Date of Patent: Nov. 15, 2022

(54) READOUT INTEGRATED CIRCUIT

(71) Applicant: Novatek Microelectronics Corp., Hsinchu (TW)

(72) Inventor: Chi-Ting Chen, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 17/168,185

(22) Filed: Feb. 5, 2021

(65) Prior Publication Data

US 2021/0248342 A1    Aug. 12, 2021

Related U.S. Application Data

(60) Provisional application No. 62/970,713, filed on Feb. 6, 2020.

(51) Int. Cl.
    *H04N 5/378*      (2011.01)
    *H01L 27/146*     (2006.01)
    (Continued)

(52) U.S. Cl.
    CPC ......... *H04N 5/378* (2013.01); *G06V 40/1318* (2022.01); *H01L 23/00* (2013.01);
    (Continued)

(58) Field of Classification Search
    CPC .... G06V 40/1318; G06V 40/13; G06V 40/12; H04N 5/378; H04N 5/335; H04N 5/374;
    (Continued)

(56) References Cited

U.S. PATENT DOCUMENTS 7,116,574 B2    10/2006    Sugahara et al.
7,304,884 B2    12/2007    Sugahara et al.
(Continued)

FOREIGN PATENT DOCUMENTS

CN      105474325      4/2016
TW      200531066      9/2005

OTHER PUBLICATIONS

"Office Action of Taiwan Counterpart Application", dated May 24, 2021, p. 1-p. 3.

*Primary Examiner* — Sanjiv D. Patel
(74) *Attorney, Agent, or Firm* — JCIPRNET (57) ABSTRACT

A readout integrated circuit configured to read out sensing signals from an optical sensing panel is provided. The optical sensing panel includes a sensor array for fingerprint sensing. The readout integrated circuit includes a plurality of input terminals, a first discharging circuit and a control circuit. The plurality of input terminals are configured to be coupled to a plurality of output terminals of the optical sensing panel. The first discharging circuit is coupled to one of the plurality of input terminals. The first discharging circuit is configured to discharge one of the plurality of output terminals of the optical sensing panel by a first current during a readout period. The readout integrated circuit reads out a voltage of the output terminal as a sensing signal. The control circuit is coupled to the first discharging circuit. The control circuit is configured to output at least one control signal to control an operating period of the first discharging circuit.

28 Claims, 9 Drawing Sheets

(51) Int. Cl.
*G06V 40/13* (2022.01)
*H01L 23/00* (2006.01)
H01L 25/16 (2006.01)
H01L 27/32 (2006.01)

(52) U.S. Cl.
CPC ...... *H01L 27/14678* (2013.01); *H01L 25/167* (2013.01); *H01L 27/32* (2013.01)

(58) Field of Classification Search
CPC .............. H04N 5/35554; H04N 5/3535; G06F 3/0412; G06F 21/32; G06F 3/042; G06F 3/0421; G06F 2207/4808
See application file for complete search history.

(56) References Cited

U.S. PATENT DOCUMENTS

| | | |
|---|---|---|
| 9,558,838 B2 | 1/2017 | Tanabe |
| 2005/0201168 A1 | 9/2005 | Sugahara et al. |
| 2006/0268599 A1 | 11/2006 | Sugahara et al. |
| 2009/0206851 A1 | 8/2009 | Chuang et al. |
| 2011/0198484 A1* | 8/2011 | Kurokawa .............. G06F 3/042 250/214 R |
| 2013/0327924 A1* | 12/2013 | Machida ........... H01L 27/14641 257/229 |
| 2016/0180948 A1 | 6/2016 | Tanabe |
| 2018/0173922 A1 | 6/2018 | Ghavanini et al. |
| 2019/0212873 A1 | 7/2019 | Huang et al. |
| 2020/0029040 A1* | 1/2020 | Johnson ............... H04N 5/3742 |
| 2020/0244907 A1* | 7/2020 | Ueno ................... H04N 5/3651 |
| 2021/0368119 A1* | 11/2021 | Hirose ................ H04N 5/3745 |

* cited by examiner

READOUT INTEGRATED CIRCUIT

CROSS-REFERENCE TO RELATED APPLICATION

This application claims the priority benefit of U.S. Provisional application Ser. No. 62/970,713, filed on Feb. 6, 2020. The entirety of the above-mentioned patent application is hereby incorporated by reference herein and made a part of this specification.

BACKGROUND

Technical Field

The invention relates to an electronic circuit, more specifically, to a readout integrated circuit.

Description of Related Art

An in-display fingerprint sensing panel equipped with optical sensors is fabricated on a lower substrate of a display panel. The optical sensors arranged as a sensor array are utilized for sensing lights reflected from a finger positioned on the fingerprint sensing panel to generate fingerprint sensing signals, and the fingerprint sensing signals are received by a fingerprint readout integrated circuit through sensing lines and output terminals of the fingerprint sensing panel. The fingerprint readout integrated circuit is configured to read out the fingerprint sensing signals and further transmit the fingerprint sensing signals that are converted to digital sensing data to a processing unit for fingerprint recognition. For example, regarding to a handheld device such as a mobile phone having a touch display screen with an in-display fingerprint sensing panel, the fingerprint readout integrated circuit in the mobile phone may transmit fingerprint sensing data to an application processor. The application processor then performs image processes on the fingerprint sensing data to generate a fingerprint image for fingerprint recognition.

However, when the size of the fingerprint sensing panel is large, transmission distances from optical sensors (called the fingerprint sensing pixels) at different positions to the output terminals of the fingerprint sensing panel may be different. Some of the optical sensors are located close to corresponding output terminals and transmit the fingerprint sensing signals through a shorter distance, whereas the other optical sensors are located far from corresponding output terminals and transmit the fingerprint sensing signals through a long distance. For the optical sensors which are far from the output terminals, the fingerprint sensing signals are transmitted through the sensing line which has a large load. It may lead to a negative impact for the fingerprint sensing signals. For example, a settling time of the fingerprint sensing signals may be too long, such that the quality of the fingerprint image generated according to the fingerprint sensing signals becomes poor.

SUMMARY

The invention is directed to a readout integrated circuit, in which the settling time of the fingerprint sensing signals is short to improve the quality of the fingerprint image.

An embodiment of the invention provides a readout integrated circuit configured to read out sensing signals from an optical sensing panel. The optical sensing panel includes a sensor array for fingerprint sensing. The readout integrated circuit includes a plurality of input terminals, a first discharging circuit and a control circuit. The plurality of input terminals are configured to be coupled to a plurality of output terminals of the optical sensing panel. The first discharging circuit is coupled to one of the plurality of input terminals. The first discharging circuit is configured to discharge one of the plurality of output terminals of the optical sensing panel by a first current during a readout period. The readout integrated circuit reads out a voltage of the output terminal as a sensing signal. The control circuit is coupled to the first discharging circuit. The control circuit is configured to output at least one control signal to control an operating period of the first discharging circuit.

In an embodiment of the invention, the first discharging circuit includes a first current source. The first current source is controlled by a first voltage to generate the first current.

In an embodiment of the invention, the first current source includes a first terminal, a second terminal and a control terminal. The first current is transmitted from the first terminal to the second terminal. The first terminal of the first current source is coupled to the output terminal. The second terminal of the first current source is coupled to a reference voltage. The control terminal of the first current source is coupled to the first voltage.

In an embodiment of the invention, the at least one control signal includes a first control signal and a second control signal. The first discharging circuit further includes a first switch element and a second switch element. The first switch element is controlled by the first control signal. The first switch element includes a first terminal, a second terminal and a control terminal. The first terminal of the first switch element is coupled to the first voltage. The second terminal of the first switch element is coupled to the control terminal of the first current source. The control terminal of the first switch element is coupled to the first control signal. The second switch element is controlled by the second control signal. The second switch element includes a first terminal, a second terminal and a control terminal. The first terminal of the second switch element is coupled to the control terminal of the first current source. The second terminal of the second switch element is coupled to the reference voltage. The control terminal of the second switch element is coupled to the second control signal.

In an embodiment of the invention, the second control signal is inverted from the first control signal. When the first switch element is conducted, the second switch element is not conducted. When the second switch element is conducted, the first switch element is not conducted.

In an embodiment of the invention, the at least one control signal includes a first control signal. The first discharging circuit further includes a first switch element. The first switch element is controlled by the first control signal. The first switch element includes a first terminal, a second terminal and a control terminal. The first terminal of the first switch element is coupled to the output terminal. The second terminal of the first switch element is coupled to the first terminal of the first current source. The control terminal of the first switch element is coupled to the first control signal.

In an embodiment of the invention, the first discharging circuit further includes a first switch element and a diode element. The first switch element is controlled by the first control signal. The first switch element includes a first terminal, a second terminal and a control terminal. The first terminal of the first switch element is coupled to the first voltage. The second terminal of the first switch element is coupled to the control terminal of the first current source. The control terminal of the first switch element is coupled to the first control signal. The diode element includes an anode terminal and a cathode terminal. The anode terminal of the diode element is coupled to the output terminal. The cathode terminal of the diode element is coupled to the first terminal of the first switch element.

In an embodiment of the invention, the readout integrated circuit further includes a second discharging circuit. The second discharging circuit is coupled to the output terminal. The second discharging circuit is configured to discharge the output terminal by a second current during the readout period.

In an embodiment of the invention, the second discharging circuit includes a second current source. The second current source is controlled by a second voltage to generate the second current.

In an embodiment of the invention, the second current source includes a first terminal, a second terminal and a control terminal. The second current is transmitted from the first terminal to the second terminal. The first terminal of the second current source is coupled to the output terminal. The second terminal of the second current source is coupled to the reference voltage. The control terminal of the second current source is coupled to the second voltage.

In an embodiment of the invention, a pre-charging circuit is coupled to the output terminal. During a pre-charging period, the pre-charging circuit is configured to charge the output terminal to an initial voltage. The pre-charging period is earlier than the readout period.

In an embodiment of the invention, the pre-charging circuit includes a third switch element. The third switch element is controlled by a third voltage. The third switch element includes a first terminal, a second terminal and a control terminal. The first terminal of the third switch element is coupled to the output terminal. The second terminal of the third switch element is coupled to the second discharging circuit. The control terminal of the third switch element is coupled to the third voltage.

In an embodiment of the invention, the second discharging circuit and the pre-charging circuit are disposed in the readout integrated circuit.

In an embodiment of the invention, the second discharging circuit and the pre-charging circuit are disposed in a display panel where the sensor array is embedded.

In an embodiment of the invention, the first current is larger than or equal to the second current.

In an embodiment of the invention, the output terminal are pre-charged to a voltage level which is approximate to a highest input voltage of an analog-to-digital converter during the pre-charging period.

An embodiment of the invention provides a readout integrated circuit configured to read out sensing signals from an optical sensing panel. The optical sensing panel includes a sensor array for fingerprint sensing. The readout integrated circuit includes a plurality of input terminals, a first charging circuit and a control circuit. The plurality of input terminals are configured to be coupled to a plurality of output terminals of the optical sensing panel. The first charging circuit is coupled to one of the plurality of input terminals. The first charging circuit is configured to charge one of the plurality of output terminals of the optical sensing panel by a first current during a readout period. The readout integrated circuit reads out a voltage of the output terminal as a sensing signal. The control circuit is coupled to the first discharging circuit. The control circuit is configured to output at least one control signal to control an operating period of the first charging circuit.

In an embodiment of the invention, the readout integrated circuit further includes a second charging circuit. The second charging circuit is coupled to the output terminal. The second charging circuit is configured to charge the output terminal by a second current during the readout period.

In an embodiment of the invention, a pre-discharging circuit is coupled to the output terminal. During a pre-discharging period, the pre-discharging circuit is configured to discharge the output terminal to an initial voltage. The pre-discharging period is earlier than the readout period.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Embodiments are provided below to describe the disclosure in detail, though the disclosure is not limited to the provided embodiments, and the provided embodiments can be suitably combined. The term "coupling/coupled" or "connecting/connected" used in this specification (including claims) of the application may refer to any direct or indirect connection means. For example, "a first device is coupled to a second device" should be interpreted as "the first device is directly connected to the second device" or "the first device is indirectly connected to the second device through other devices or connection means." In addition, the term "signal" can refer to a current, a voltage, a charge, a temperature, data, electromagnetic wave or any one or multiple signals.

Figure 1:
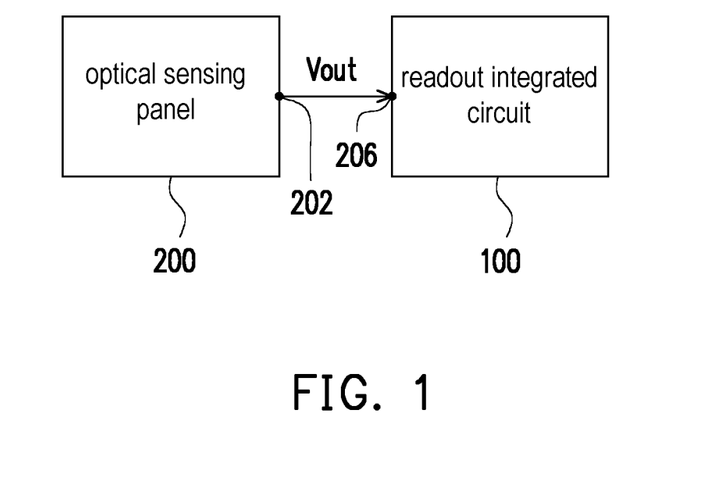
FIG. 1 is a schematic block diagram illustrating a readout integrated circuit and an optical sensing panel according to an embodiment of the invention.
Figure 2:
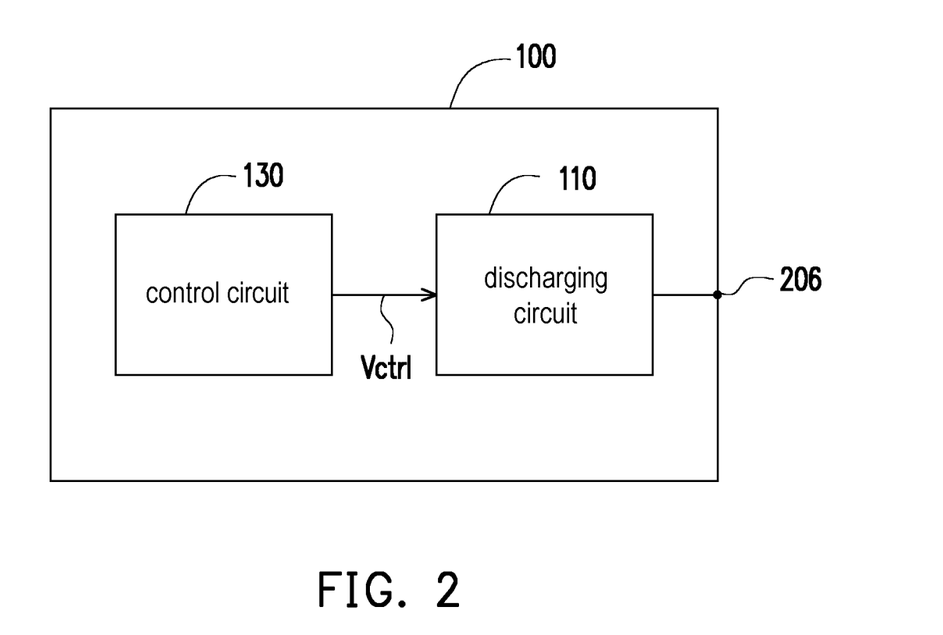
FIG. 2 is a schematic block diagram illustrating the readout integrated circuit depicted in FIG. 1 according to an embodiment of the invention.
Figure 3:
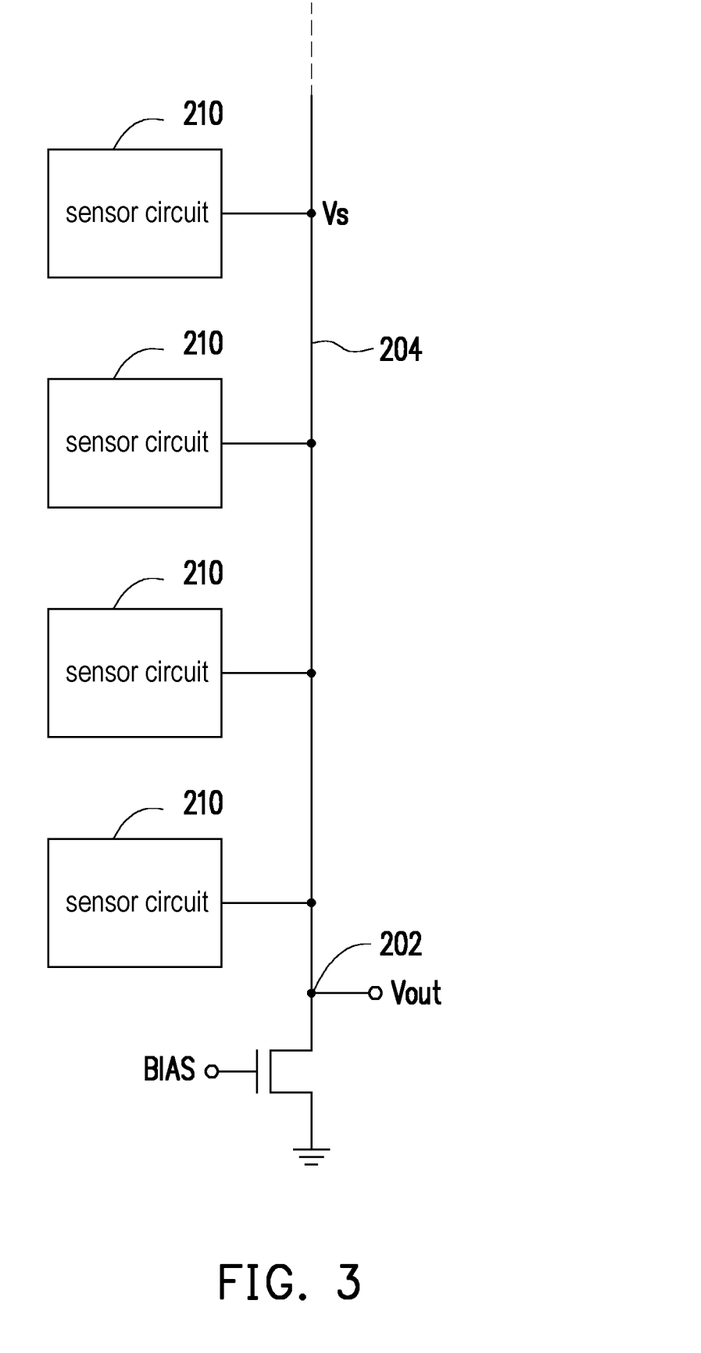
FIG. 3 is a schematic diagram illustrating a plurality of sensor circuits arranged in a column of a sensor array in the optical sensing panel depicted in FIG. 1 according to an embodiment of the invention.

FIG. 1 is a schematic block diagram illustrating a readout integrated circuit and an optical sensing panel according to an embodiment of the invention. In this embodiment, the optical sensing panel is an in-display fingerprint sensing panel which is fabricated in a display panel. FIG. 2 is a schematic block diagram illustrating the readout integrated circuit depicted in FIG. 1 according to an embodiment of the invention. FIG. 3 is a schematic diagram illustrating a plurality of sensor circuits arranged in a column of a sensor array in the optical sensing panel depicted in FIG. 1 according to an embodiment of the invention.

Referring to FIG. 1 to FIG. 3, an optical sensing panel 200 includes a sensor array formed by a plurality of sensor circuits 210 serving as sensing pixels, a plurality of sensing lines 204, and a plurality of output terminals 202 which are capable of outputting fingerprint sensing signals. Each column of sensor circuits is coupled to a respective sensing line 204. The number of the output terminals 202 of the optical sensing panel 200 may be the same as or less than the number of the sensing lines 204.

A readout integrated circuit 100 includes a plurality of input terminals 206, and the plurality of input terminals 206 are configured to be coupled to some of the plurality of output terminals 202 of the optical sensing panel 200. It is noted that, for a current fingerprint sensing operation, the number of fingerprint sensing signals being processed at the same time by the readout integrated circuit 100 is determined based on circuit design of the readout integrated circuit 100, which may be related but not limited to the number of analog front-end circuits in the readout integrated circuit 100 that can parallel process the received fingerprint sensing signals. The locations and the quantity of the sensor circuits which are active for a current fingerprint sensing operation may not be all of the sensor circuits of the optical sensing panel 200. These active sensor circuits for a current fingerprint sensing operation may be a predetermined part of the sensor array or may be determined according to a touch position with respect to a touch event. In an example, the optical sensing panel 200 may have 1080 columns of sensor circuits, 1080 sensing lines and 1080 output terminals, and the readout integrated circuit 100 includes 250 input terminals, such that only 250 output terminals of the 1080 output terminals of the optical sensing panel 200 are respectively coupled to the 250 input terminals of the readout integrated circuit 100. Thus, at the same time, fingerprint sensing signals generated from 250 sensor circuits among a row can be transmitted to the readout integrated circuit 100 through the 250 output terminals.

In FIG. 3, only the sensor circuits 210 coupled to the same sensing line 204 are illustrated for example, but the invention is not limited thereto. In view point of the readout integrated circuit 100, the input terminals 206 of the readout integrated circuit 100 are coupled to a part of the sensing lines 204 via a part of the output terminals 202. The readout integrated circuit 100 is configured to read out an output voltage Vout of the output terminal 202, which is ideally expected to be equivalent to an output voltage of a sensor circuit, called a sensing voltage Vs. However, more distance from the sensor circuit to the output terminal 202, more load resulted from the resistance and capacitance of the sensing line 204, and it costs more time to make the output voltage Vout of the output terminal 202 settle to the sensing voltage Vs. It should be noted that, regarding the output voltage Vout of the output terminals 202 during a readout period, a process from the output voltage Vout at the beginning of a readout period to the sensing voltage Vs that the sensor circuit actually outputs may be regarded as a discharging process if the output voltage Vout at the beginning of the readout period is higher than the sensing voltage Vs. Herein, the output voltage Vout of the output terminals 202 at the beginning of the readout period is determined based on a circuit design of the readout integrated circuit. The following embodiments about FIG. 5 to FIG. 9 is illustrated based on the case that the output voltage Vout settling (to the sensing voltage Vs) is as a discharging process. In other embodiments, e.g. FIG. 11 and FIG. 12, a process from the output voltage Vout at the beginning of the readout period to the sensing voltage Vs that the sensor circuit actually outputs may be regarded as a charging process if the output voltage Vout at the beginning of the readout period is lower than the sensing voltage Vs that the sensor circuit actually outputs. The output voltage Vout of the output terminals 202 at the beginning of the readout period is call an initial voltage hereinafter. The initial voltage may be determined by a pre-charging process (or a pre-discharging process) which is described in the following.

Figure 5:
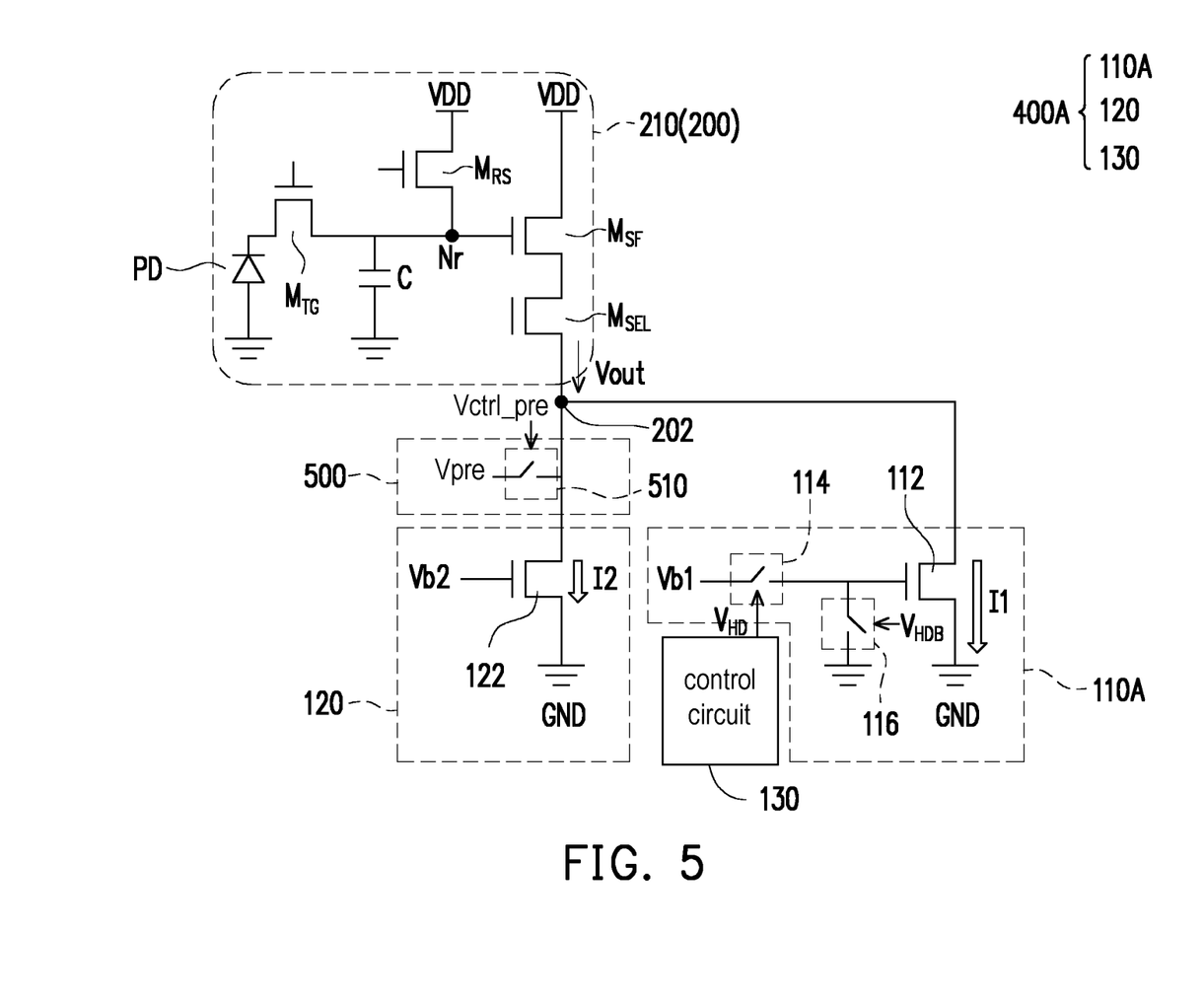
FIG. 5 is a schematic diagram illustrating a sensor circuit and a readout integrated circuit according to an embodiment of the invention.

The readout integrated circuit 100 further includes a first discharging circuit 110 and a control circuit 130. The first discharging circuit 110 is coupled to one of the input terminal 206 as illustrated in FIG. 2. That is, the first discharging circuit 110 is coupled to one of the output terminals 202 of the optical sensing panel 200 via the input terminal 206. In an implementation, since the first discharging circuit 110 may serve multiple output terminals 202, the first discharging circuit 110 may be coupled to multiple input terminals 206 and then coupled to corresponding output terminals 202 through the input terminals 206. The first discharging circuit 110 is configured to discharge the output terminal 202 or more output terminals 202 by a first current I1 as shown in FIG. 5 during a readout period. The readout integrated circuit 100 reads out an output voltage Vout of the output terminal 202 as a sensing signal (or reads out more voltages Vout of the plurality of output terminals 202 as the sensing signals). The control circuit 130 is coupled to the first discharging circuit 110, and configured to output at least one control signal Vctrl to control an operating period of the first discharging circuit 110.

Figure 4:
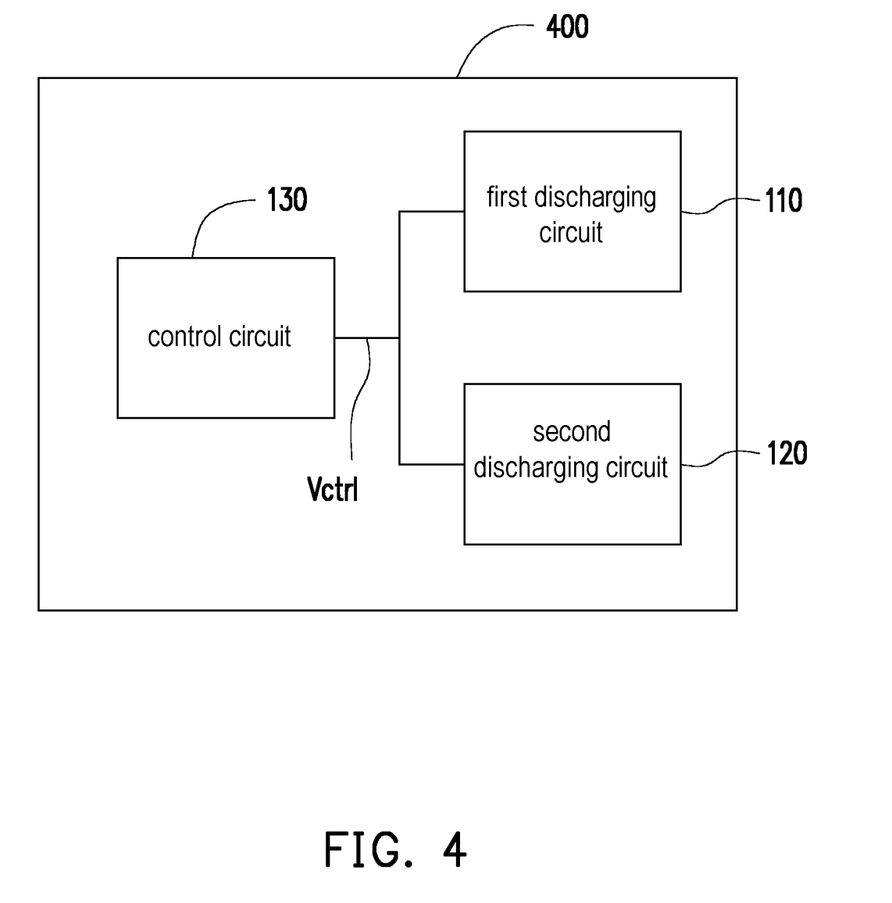
FIG. 4 is a schematic block diagram illustrating a readout integrated circuit according to another embodiment of the invention.

FIG. 4 is a schematic block diagram illustrating a readout integrated circuit according to another embodiment of the invention. Referring to FIG. 2 and FIG. 4, the readout integrated circuit 400 of the present embodiment is similar to the readout integrated circuit 100 of FIG. 2, and the main difference therebetween, for example, lies in that the readout integrated circuit 400 further includes a second discharging circuit 120. The second discharging circuit 120 is coupled to the output terminal 202 (or more output terminals 202) of the optical sensing panel 200 as illustrated in FIG. 3. The second discharging circuit 120 is configured to discharge the output terminal 202 (or more the plurality of output terminals 202) by a second current I2 as shown in FIG. 5 during the readout period.

FIG. 5 is a schematic diagram illustrating a sensor circuit and a readout integrated circuit according to an embodiment of the invention. FIG. 5 is illustrated based on that the process that the output voltage Vout settling to steady state (i.e. to arrive at the sensing voltage Vs) is regarded as a discharging process. Referring to FIG. 5, the readout integrated circuit 400A includes the first discharging circuit 110A, the second discharging circuit 120 and the control circuit 130. In addition, a pre-charging circuit 500 is coupled to an output terminal 202 of the optical sensing panel 200. Circuit structures of the sensor circuit 210, the first discharging circuit 110A, the second discharging circuit 120 and the pre-charging circuit 500 are further illustrated in FIG. 5. However, the circuit structures thereof do not intend to limit the invention. In another embodiment based on that the process that the output voltage Vout settling to steady state (i.e. to arrive at the sensing voltage Vs) is regarded as a charging process. The first discharging circuit 110A may be replaced with a first charging circuit including similar switch elements and a current source providing a current as an inverse first current I1, to charge the output terminal 202, and wherein the reference voltage may be a supply voltage. The control circuit 130 can also be used for controlling the operating period of the first charging circuit. The second discharging circuit 120 may be replaced with a second charging circuit, and the pre-charging circuit 500 may be replaced with a pre-discharging circuit. Similarly, embodiments of FIG. 8 and FIG. 9 may have an alternative version based on that the output voltage Vout settling is regarded as a charging process.

An active pixel structure of four transistors is taken as an example for the sensor circuit 210. In a reset period, a reset transistor $M_{RS}$ is conducted, and a voltage at a node Nr is pulled up to a high voltage VDD to turn off the source follower formed by the transistor $M_{SF}$. At the reset period, an output voltage Vout of the output terminal 202 is discharged. In an exposure period, a photo-sensing mechanism is performed, and a photodiode PD is leaking. In a readout period, a select transistor $M_{SEL}$ is conducted, and then the reset transistor $M_{RS}$ is conducted again. Next, a transfer transistor $M_{TG}$ is conducted, and a sensing voltage with respect to fingerprint information is transmitted to the node Nr. Therefore, the voltage at the node Nr changes from the high voltage VDD to the sensing voltage, which is lower than the high voltage VDD. In the readout period, the output voltage Vout at the steady state is determined by the voltage at the node Nr. For example, when the voltage at the node Nr in the readout period is a voltage 2V, the output voltage Vout at the steady state is approximate to a voltage 2V−Vgs, where Vgs is a voltage difference between a gate terminal and a source terminal of the source follower formed by a transistor $M_{SF}$. Therefore, the output voltage Vout is read out in the readout period, and serves as a sensing signal. Whether the output terminal 202 is being discharged or charged is determined upon the initial voltage of the output terminal 202 at the beginning of the readout period, and in the embodiments of FIG. 5, the initial voltage may be determined in a pre-charging process by a pre-charging voltage Vpre.

The first discharging circuit 110A includes a first current source 112, a first switch element 114 and a second switch element 116. The first current source 112 is controlled by a first voltage Vb1 to generate the first current I1. The first current source 112 include a first terminal, a second terminal and a control terminal. The first current I1 is transmitted from the first terminal to the second terminal. The first terminal of the first current source 112 is coupled to the output terminal 202. The second terminal of the first current source 112 is coupled to a reference voltage. The control terminal of the first current source 112 is coupled to the first voltage Vb1. In the present embodiment, the reference voltage may be a ground voltage GND, but the invention is not limited thereto.

The first switch element 114 is controlled by a first control signal $V_{HD}$. The first switch element 114 includes a first terminal, a second terminal and a control terminal. The first terminal of the first switch element 114 is coupled to the first voltage Vb1. The second terminal of the first switch element 114 is coupled to the control terminal of the first current source 112. The control terminal of the first switch element 114 is coupled to the first control signal $V_{HD}$.

The second switch element 116 is controlled by a second control signal $V_{HDB}$. The second switch element 116 includes a first terminal, a second terminal and a control terminal. The first terminal of the second switch element 116 is coupled to the control terminal of the first current source 112. The second terminal of the second switch element 116 is coupled to the reference voltage GND. The control terminal of the second switch element 116 is coupled to the second control signal $V_{HDB}$. In the present embodiment, the second control signal $V_{HDB}$ is inverted from the first control signal $V_{HD}$. The second control signal $V_{HDB}$ is an inverse signal of the first control signal $V_{HD}$. When the first switch element 114 is conducted by the first control signal $V_{HD}$, the second switch element 116 is not conducted. When the second switch element 116 is conducted by the second control signal $V_{HDB}$, the first switch element 114 is not conducted. The second switch element 116 can be conducted to ensure the first current source 112 is turned off.

The second discharging circuit 120 is coupled to the output terminal 202 of the optical sensing panel 200. The second discharging circuit 120 is configured to discharge the output terminal 202 by a second current I2 during the readout period. The second discharging circuit 120 includes a second current source 122. The second current source 122 is controlled by a second voltage Vb2 to generate the second current I2. The second current source 122 includes a first terminal, a second terminal and a control terminal. The second current I2 is transmitted from the first terminal to the second terminal. The first terminal of the second current source 122 is coupled to the output terminal 202. The second terminal of the second current source 122 is coupled to the reference voltage GND. The control terminal of the second current source 122 is coupled to the second voltage Vb2.

In an embodiment, the first current I1 is larger than the second current I2, such that the discharging operation is dominated by the first discharging circuit 110A, but the invention is not limited thereto. In another embodiment, the first current I1 may be equal to the second current I2. The power consumption of the optical sensing panel 200 may be reduced because power consumption regarding to the first current source 112 belongs to power consumption of the readout integrated circuit 100, not to the optical sensing panel 200. The control circuit 130 is coupled to the first discharging circuit 110A. The control circuit 130 outputs at least one control signal to control an operating period of the first discharging circuit 110A. For example, the control circuit 130 may output the first control signal $V_{HD}$ and the second control signal $V_{HDB}$ to control the operating period of the first discharging circuit 110A. The operating period of the first discharging circuit 110A indicates a period that the first discharging circuit 110A discharges the output terminal 202 of the optical sensing panel 200.

In an embodiment, the control circuit 130 may include a controller implemented by one or more processing elements, such as an array of logic gates, an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result.

The pre-charging circuit 500 is coupled to the output terminal 202 of the optical sensing panel 200. The pre-charging circuit 500 is configured to charge the output terminal 202 to an initial voltage during a pre-charging period. The pre-charging period is earlier than the readout period. The pre-charging circuit 500 includes a third switch element 510. The third switch element 510 is controlled by a third control signal Vctrl_pre. The third switch element 510 includes a first terminal, a second terminal and a control terminal. The first terminal of the third switch element 510 is coupled to the output terminal 202. The second terminal of the third switch element 510 is coupled to the second discharging circuit 120. The control terminal of the third switch element 510 is coupled to a pre-charging voltage Vpre. When the third switch element 510 is conducted by the third control signal Vctrl_pre, the output terminal 202 is charged to the initial voltage during the pre-charging period. The third control signal Vctrl_pre may be outputted from the control circuit 130 or other external control circuits.

In the present embodiment, the second discharging circuit 120 and the pre-charging circuit 500 are disposed in the readout integrated circuit 400A. That is to say, the readout integrated circuit 400A includes the second discharging circuit 120 and the pre-charging circuit 500 and is implemented in a single semiconductor chip or circuitry, but the invention is not limited thereto. In an embodiment, the second discharging circuit 120, the pre-charging circuit 500, and the readout integrated circuit 400A can be implemented in separate devices. For example, the second discharging circuit 120 and the pre-charging circuit 500 are disposed in a display panel where the optical sensing panel 200 is embedded.

Figure 6:
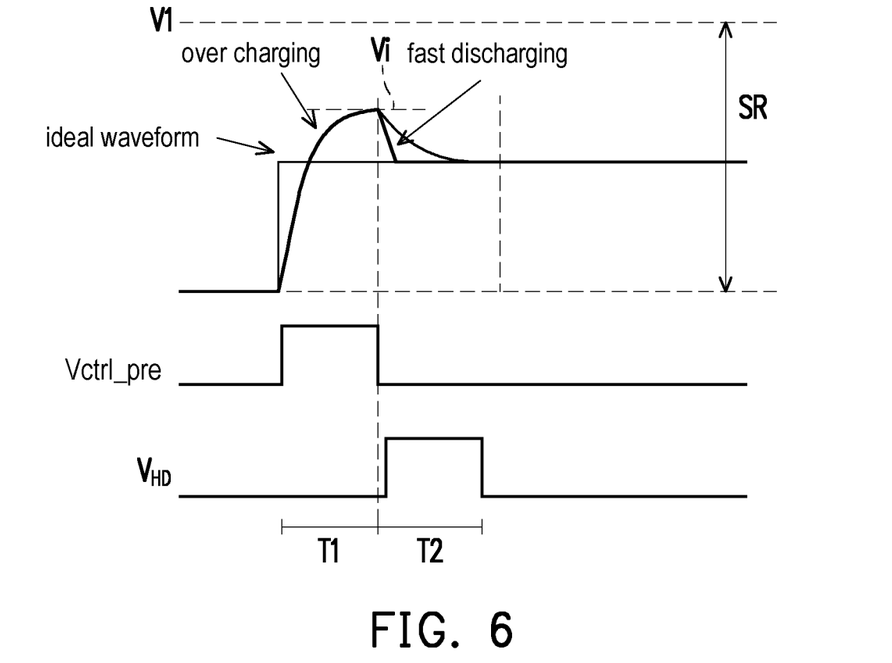
FIG. 6 is a waveform diagram of a voltage at the output terminal during different operation periods according to an embodiment of the invention.

FIG. 6 is a waveform diagram of a voltage at the output terminal during different operation periods according to an embodiment of the invention. Referring to FIG. 5 and FIG. 6, the pre-charging circuit 500 charges the output terminal 202 to the initial voltage Vi during the pre-charging period T1. The first discharging circuit 110A and the second discharging circuit 120 discharge the output terminal 202 during the readout period T2, such that a discharging speed of the output voltage Vout can become faster. The settling time of the fingerprint sensing signals, i.e. the output voltages Vout, is short to improve the quality of the fingerprint image. The settling time is the time required for the output voltage Vout to reach and remain within a given band. The readout period T2 is an operating period of the first discharging circuit 110A, and a time span of the operating period is controlled by the first control signal $V_{HD}$.

In the present embodiment, the output voltage Vout may be transmitted to an analog-front-end circuit (not shown) then to an analog-to-digital converter (not shown) in the readout integrated circuit 400, or may be transmitted to the analog-to-digital converter in the readout integrated circuit 400 without being processed through the analog-front-end circuit if there is no analog-front-end circuit. A signal range SR is an input voltage range of the analog-to-digital converter. The output terminal 202 is pre-charged to a voltage level which is lower than a highest input voltage V1 of the analog-to-digital converter during the pre-charging period, but the invention is not limited thereto. In an embodiment, the output terminal 202 may be pre-charged to the voltage level which is approximate to the highest input voltage V1 of the analog-to-digital converter during the pre-charging period.

Figure 7:
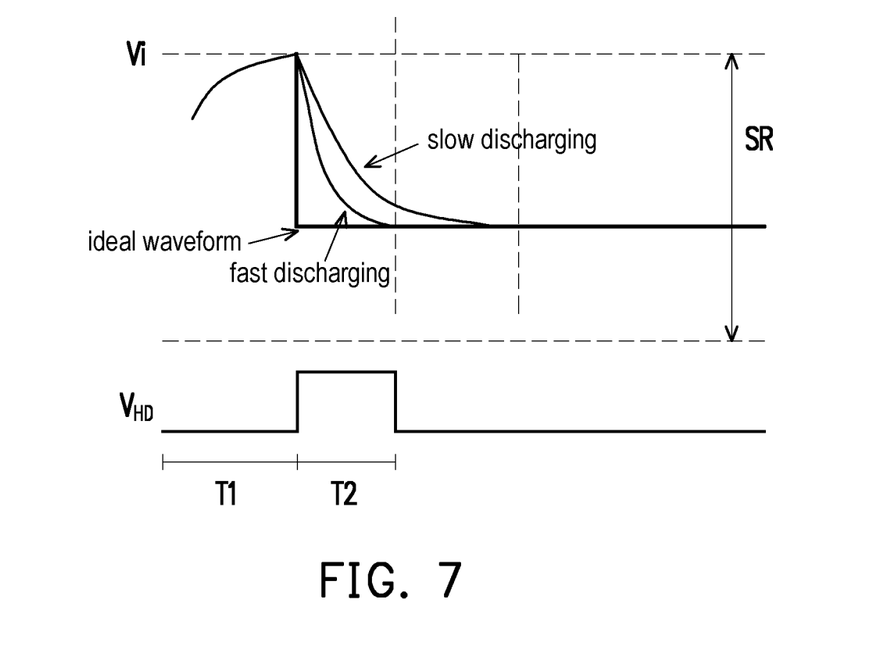
FIG. 7 is a waveform diagram of a voltage at the output terminal during different operation periods according to another embodiment of the invention.

FIG. 7 is a waveform diagram of a voltage at the output terminal during different operation periods according to another embodiment of the invention. Referring to FIG. 5 and FIG. 7, the output terminal 202 is pre-charged to the initial voltage Vi, and the voltage level of the initial voltage Vi is approximate to the highest input voltage V1 of the analog-to-digital converter during the pre-charging period T1. The first discharging circuit 110A and the second discharging circuit 120 further discharge the output terminal 202 during the readout period T2, such that a discharging speed of the output voltage can become faster. In addition, the pre-charging operation may be performed during the reset period, before the readout period (which means an exposure period), or an early stage of the readout period before the select switch $M_{SEL}$ is conducted.

Figure 8:
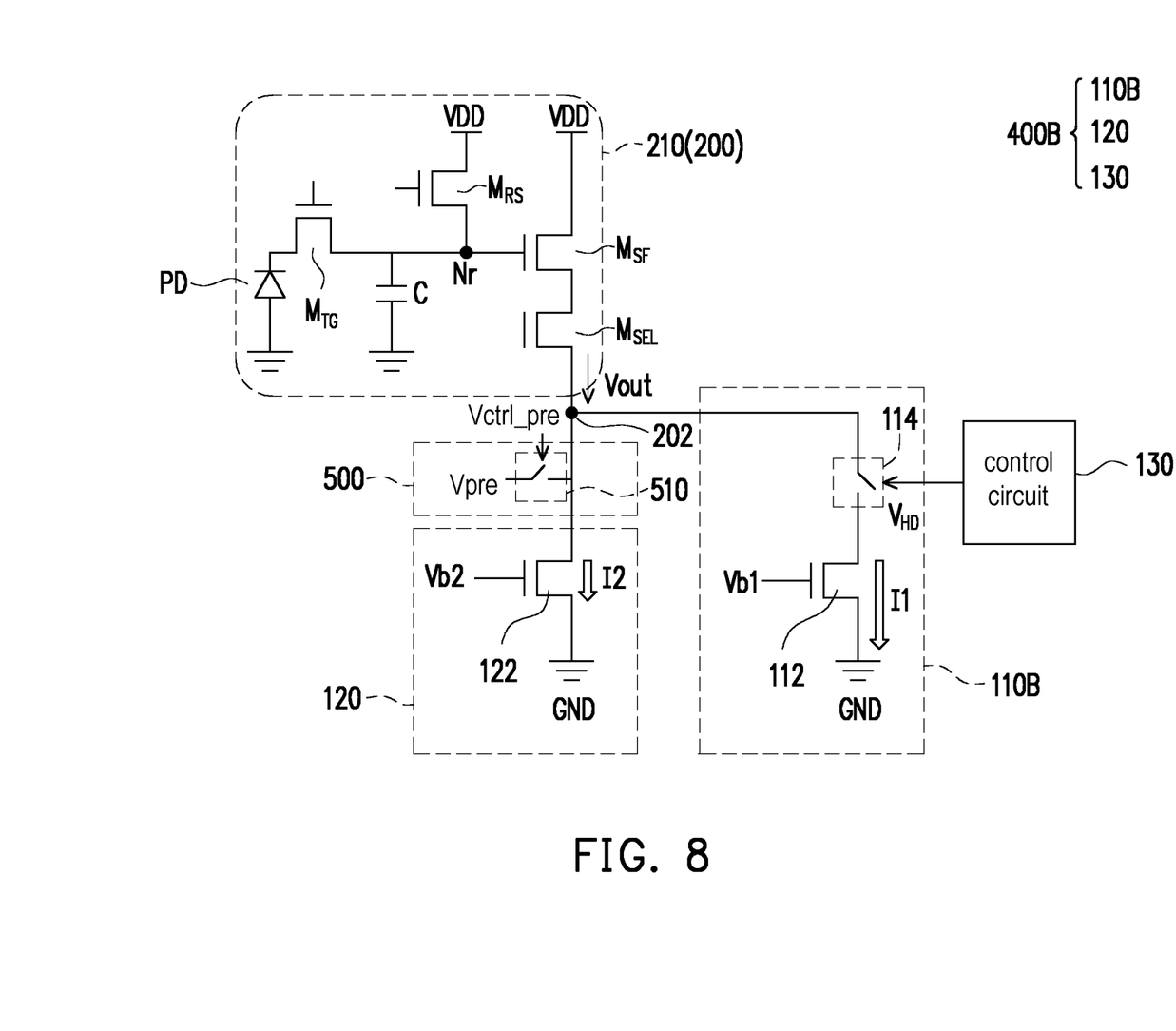
FIG. 8 is a schematic diagram illustrating a sensor circuit and a readout integrated circuit according to another embodiment of the invention.

FIG. 8 is a schematic diagram illustrating a sensor circuit and a readout integrated circuit according to another embodiment of the invention. Referring to FIG. 5 and FIG. 8, the readout integrated circuit 400B of the present embodiment is similar to the readout integrated circuit 400A of FIG. 5, and the main difference therebetween, for example, lies in the circuit structure of the first discharging circuit 110B.

To be specific, the first discharging circuit 110B includes the first current source 112 and the first switch element 114. The first switch element 114 is controlled by the first control signal $V_{HD}$. The first switch element 114 include a first terminal, a second terminal and a control terminal. The first terminal of the first switch element 114 is coupled to the output terminal 202. The second terminal of the first switch element 114 is coupled to the first terminal of the first current source 112. The control terminal of the first switch element 112 is coupled to the first control signal $V_{HD}$. The control circuit 130 can directly turn on or turn off a discharging path of the output voltage Vout by controlling a conduction state of the first switch element 114.

The operation of the readout integrated circuit 400B, the second discharging circuit 120 and the pre-charging circuit 500 described in the embodiment of the invention is sufficiently taught, suggested, and embodied in the embodiments illustrated in FIG. 5, and therefore no further description is provided herein.

Figure 9:
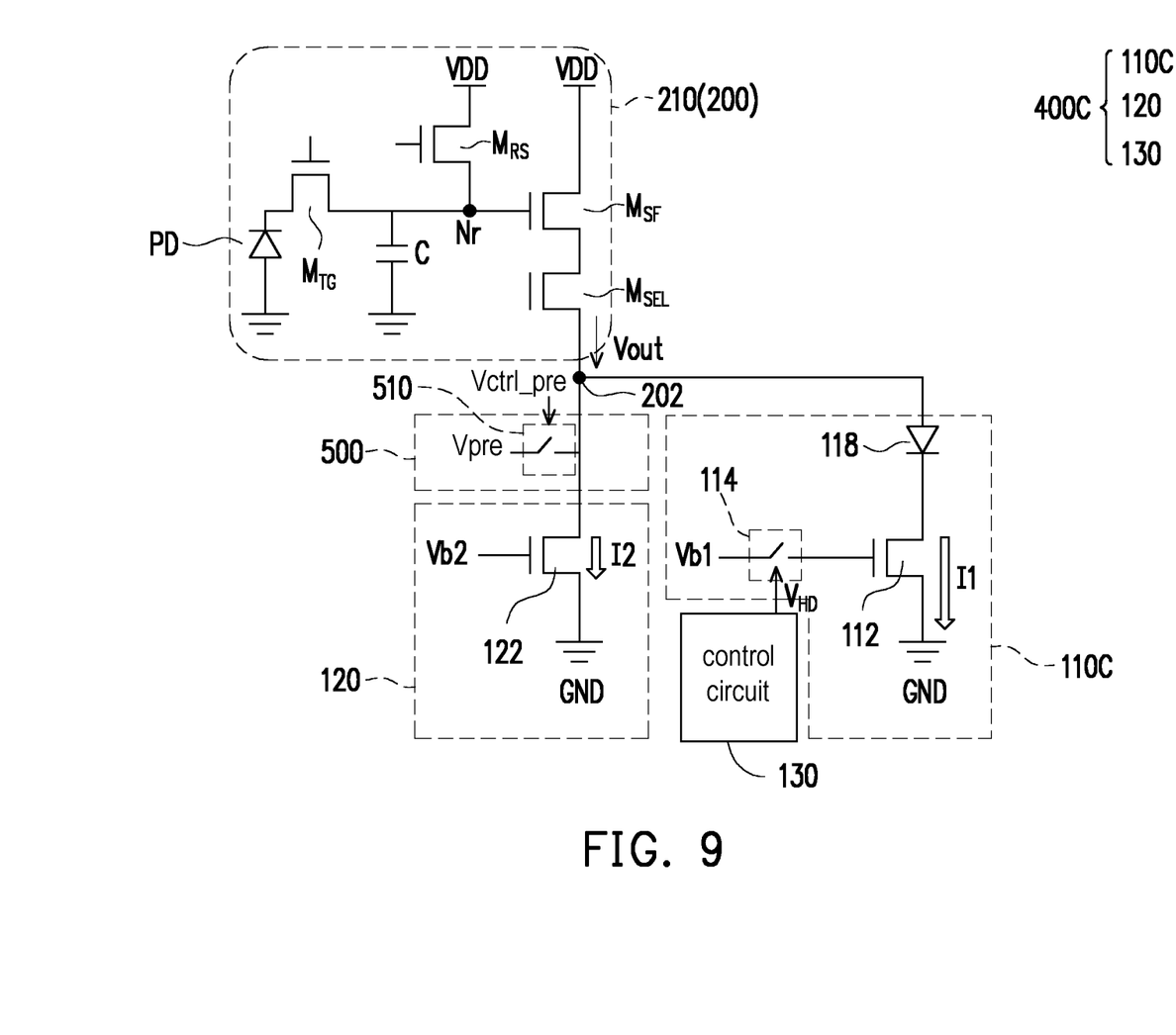
FIG. 9 is a schematic diagram illustrating a sensor circuit and a readout integrated circuit according to another embodiment of the invention.

FIG. 9 is a schematic diagram illustrating a sensor circuit and a readout integrated circuit according to another embodiment of the invention. Referring to FIG. 5 and FIG. 9, the readout integrated circuit 400C of the present embodiment is similar to the readout integrated circuit 400A of FIG. 5, and the main difference therebetween, for example, lies in the circuit structure of the first discharging circuit 110C.

To be specific, the first discharging circuit 110C includes the first current source 112, the first switch element 114, and a diode element 118. The first switch element 114 is controlled by the first control signal $V_{HD}$. The first switch element 114 includes a first terminal, a second terminal and a control terminal. The first terminal of the first switch element 114 is coupled to the first voltage Vb1. The second terminal of the first switch element 114 is coupled to the control terminal of the first current source 112. The control terminal of the first switch element 114 is coupled to the first control signal $V_{HD}$. The diode element 118 includes an anode terminal and a cathode terminal. The anode terminal of the diode element 118 is coupled to the output terminal 202, and the cathode terminal of the diode element 118 is coupled to the first terminal of the first switch element 114.

The diode element 118 can avoid that the output voltage Vout is pulled down to a specified voltage. For example, when the output voltage Vout is pulled down to the specified voltage, the diode element 118 is not conducted, such that the first current source 112 is turned off to stop the discharging operation.

The operation of the readout integrated circuit 400C, the second discharging circuit 120 and the pre-charging circuit 500 described in the embodiment of the invention is sufficiently taught, suggested, and embodied in the embodiments illustrated in FIG. 5, and therefore no further description is provided herein.

Figure 10:
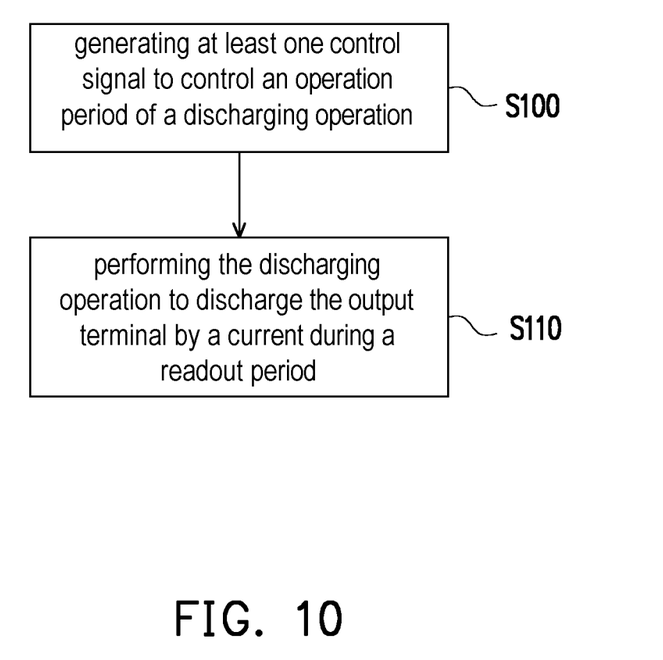
FIG. 10 is a flowchart illustrating a method for operating a readout integrated circuit according to an embodiment of the invention.

FIG. 10 is a flowchart illustrating a method for operating a readout integrated circuit according to an embodiment of the invention. Referring to FIG. 1, FIG. 2 and FIG. 10, in the present embodiment, the method for operating the readout integrated circuit is at least adapted to the readout integrated circuit 100 depicted in FIG. 1 and FIG. 2, but the disclosure is not limited thereto. Taking the readout integrated circuit 100 for example, in step S100, the readout integrated circuit 100 generates at least one control signal Vctrl to control an operation period of a first discharging operation. In step S110, the readout integrated circuit 100 performs the first discharging operation to discharge the output terminal 202 by a first current I1 during a readout period. Therefore, voltages of the plurality of output terminals 202 of the sensor array 202 can be read out as the sensing signals.

The method for operating the readout integrated circuit described of the embodiment of the invention is sufficiently taught, suggested, and embodied in the embodiments illustrated in FIG. 1 to FIG. 9, and therefore no further description is provided herein.

Figure 11:
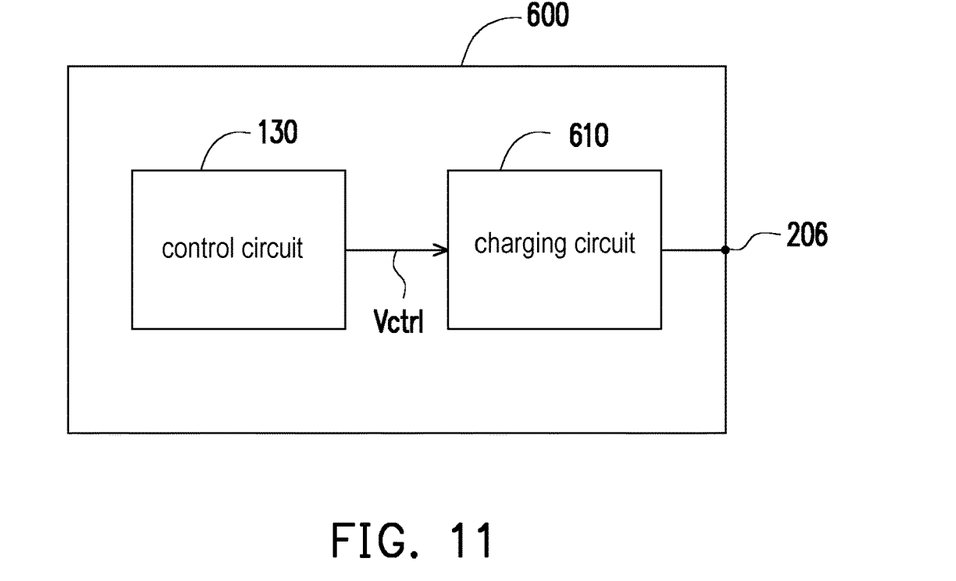
FIG. 11 is a schematic block diagram illustrating a readout integrated circuit according to another embodiment of the invention.

FIG. 11 is a schematic block diagram illustrating a readout integrated circuit according to another embodiment of the invention. Referring to FIG. 11, a readout integrated circuit 600 includes a plurality of input terminals 206, and the plurality of input terminals 206 are configured to be coupled to some of the plurality of output terminals 202 of the optical sensing panel 200. The readout integrated circuit 100 further includes a first charging circuit 610 and the control circuit 130. The first charging circuit 610 is coupled to an input terminal 206 (or more input terminals 206) as illustrated in FIG. 2. That is, the first charging circuit 610 is coupled to an output terminal 202 of the optical sensing panel 200 via the input terminal 206. The first charging circuit 610 is configured to charge the output terminal 202 by a first current I1 during a readout period. The readout integrated circuit 600 reads out the voltage Vout of the output terminal 202 as the sensing signal. The control circuit 130 is coupled to the first charging circuit 610, and configured to output at least one control signal Vctrl to control an operating period of the first charging circuit 110.

Figure 12:
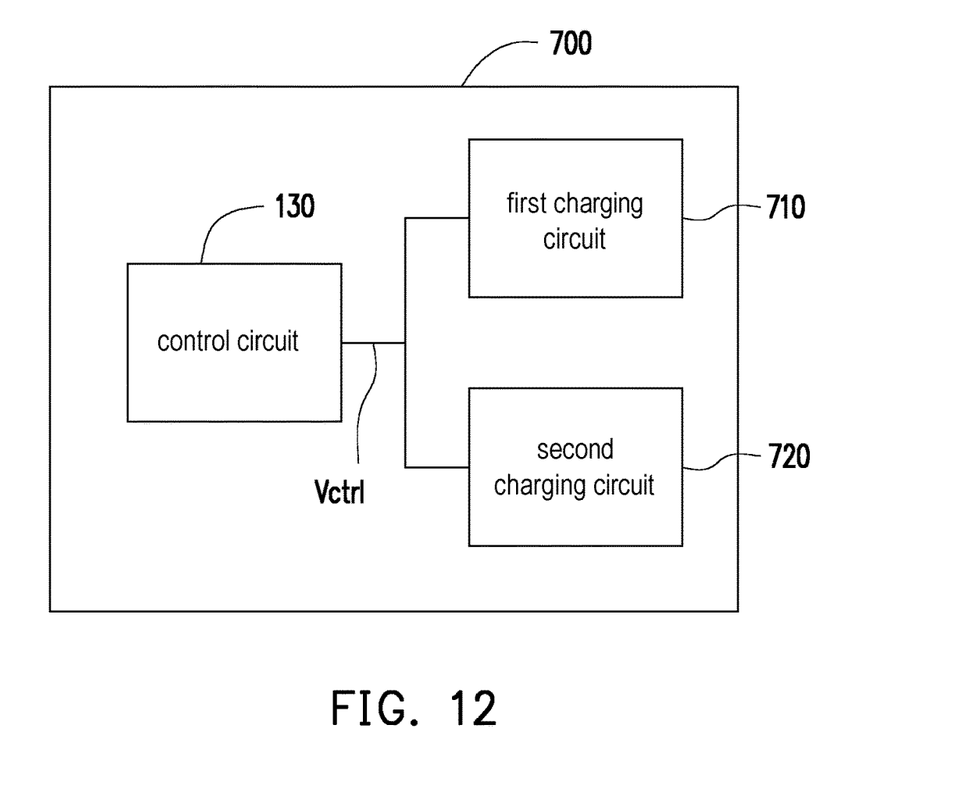
FIG. 12 is a schematic block diagram illustrating a readout integrated circuit according to another embodiment of the invention.

FIG. 12 is a schematic block diagram illustrating a readout integrated circuit according to another embodiment of the invention. Referring to FIG. 11 and FIG. 12, the readout integrated circuit 700 of the present embodiment is similar to the readout integrated circuit 600 of FIG. 11, and the main difference therebetween, for example, lies in that the readout integrated circuit 700 further includes a second charging circuit 720. The second charging circuit 720 is coupled to the output terminal 202 of the optical sensing panel 200 as illustrated in FIG. 3. The second charging circuit 720 is configured to charge the output terminal 202 by a second current I2 during the readout period.

In the embodiments of FIG. 11 and FIG. 12, a process from the output voltage Vout at the beginning of the readout period to the sensing voltage Vs that the sensor circuit actually outputs may be regarded as a charging process if the output voltage Vout at the beginning of the readout period is lower than the sensing voltage Vs that the sensor circuit actually outputs. The output voltage Vout of the output terminals 202 at the beginning of the readout period is call an initial voltage. The initial voltage may be determined by a pre-discharging process.

The operation of the readout integrated circuit described in the embodiment of FIG. 11 and FIG. 12 is sufficiently taught, suggested, and embodied in the embodiments illustrated in FIG. 1 to FIG. 10, and therefore no further description is provided herein.

In summary, in the embodiments of the invention, a charging/discharging circuit is further added to the readout integrated circuit to charge or discharge the output terminals of the sensor array by a current during a readout period. Therefore, a charging/discharging speed of the fingerprint sensing signals can become faster, and the settling time of the fingerprint sensing signals is short to improve the quality of the fingerprint image.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A readout integrated circuit, configured to read out sensing signals from an optical sensing panel comprising a sensor array for fingerprint sensing, the readout integrated circuit comprising:
   a plurality of input terminals, configured to be coupled to a plurality of output terminals of the optical sensing panel;
   a first discharging circuit, coupled to one of the plurality of input terminals and configured to discharge an output terminal included in the plurality of output terminals of the optical sensing panel by a first current during a readout period, wherein the readout integrated circuit reads out a voltage of the output terminal of the optical sensing panel as a sensing signal; and
   a control circuit, coupled to the first discharging circuit and configured to output a control signal to control an operating period which is a time length that the first discharging circuit discharges the output terminal of the optical sensing panel by the first current,
   wherein the first discharging circuit comprises:
      a first switch element, controlled to be either conducted or not by the control signal, wherein a first terminal of the first switch element is coupled to the output terminal of the optical sensing panel, and a control terminal of the first switch element is coupled to the control signal; and
      a first current source, coupled to a second terminal of the first switch element, wherein the first current source is configured to generate the first current.

2. The readout integrated circuit of claim 1, wherein the first current source is controlled by a first voltage to generate the first current.

3. The readout integrated circuit of claim 2, wherein the first current source comprises a first terminal, a second terminal and a control terminal, and the first current is transmitted from the first terminal of the first current source to the second terminal of the first current source,
   wherein the first terminal of the first current source is coupled to the second terminal of the first switch element, the second terminal of the first current source is coupled to a reference voltage, and the control terminal of the first current source is coupled to the first voltage.

4. The readout integrated circuit of claim 1, further comprising
a second discharging circuit, coupled to the output terminal of the optical sensing panel and configured to discharge the output terminal of the optical sensing panel by a second current during the readout period.

5. The readout integrated circuit of claim 4, wherein the second discharging circuit comprises:
a second current source, controlled by a second voltage to generate the second current.

6. The readout integrated circuit of claim 5, wherein the second current source comprises a first terminal, a second terminal and a control terminal, and the second current is transmitted from the first terminal of the second current source to the second terminal of the second current source, wherein the first terminal of the second current source is coupled to the output terminal of the optical sensing panel, the second terminal of the second current source is coupled to a reference voltage, and the control terminal of the second current source is coupled to the second voltage.

7. The readout integrated circuit of claim 4, wherein
a pre-charging circuit, coupled to the output terminal of the optical sensing panel and configured to charge the output terminal of the optical sensing panel to an initial voltage during a pre-charging period, wherein the pre-charging period is earlier than the readout period.

8. The readout integrated circuit of claim 7, wherein the pre-charging circuit comprises:
a third switch element, controlled by a third voltage and comprising a first terminal, a second terminal and a control terminal, wherein the first terminal of the third switch element is coupled to the output terminal of the optical sensing panel, the second terminal of the third switch element is coupled to the second discharging circuit, and the control terminal of the third switch element is coupled to the third voltage.

9. The readout integrated circuit of claim 7, wherein the second discharging circuit and the pre-charging circuit are disposed in the readout integrated circuit.

10. The readout integrated circuit of claim 7, wherein the second discharging circuit and the pre-charging circuit are disposed in a display panel where the sensor array is embedded.

11. The readout integrated circuit of claim 4, wherein the first current is larger than or equal to the second current.

12. The readout integrated circuit of claim 7, wherein the output terminal of the optical sensing panel is pre-charged to a voltage level which is approximate to a highest input voltage of an analog-to-digital converter during the pre-charging period.

13. A readout integrated circuit, configured to read out sensing signals from an optical sensing panel comprising a sensor array for fingerprint sensing, the readout integrated circuit comprising:
a plurality of input terminals, configured to be coupled to a plurality of output terminals of the optical sensing panel;
a first charging circuit, coupled to one of the plurality of input terminals and configured to charge an output terminal included in the plurality of output terminals of the optical sensing panel by a first current during a readout period, wherein the readout integrated circuit reads out a voltage of the output terminal of the optical sensing panel as a sensing signal; and
a control circuit, coupled to the first charging circuit and configured to output a control signal to control an operating period which is a time length that the first charging circuit charges the output terminal of the optical sensing panel by the first current,
wherein the first charging circuit comprises:
a first switch element, controlled to be either conducted or not by the control signal, wherein a first terminal of the first switch element is coupled to the output terminal of the optical sensing panel, and a control terminal of the first switch element is coupled to the control signal; and
a first current source, coupled to a second terminal of the first switch element, wherein the first current source is configured to generate the first current.

14. The readout integrated circuit of claim 13, wherein the first current source is controlled by a first voltage to generate the first current.

15. The readout integrated circuit of claim 14, wherein the first current source comprises a first terminal, a second terminal and a control terminal, and the first current is transmitted from the first terminal of the first current source to the second terminal of the first current source,
wherein the first terminal of the first current source is coupled to the second terminal of the first switch element, the second terminal of the first current source is coupled to a reference voltage, and the control terminal of the first current source is coupled to the first voltage.

16. The readout integrated circuit of claim 13, further comprising
a second charging circuit, coupled to the output terminal of the optical sensing panel and configured to charge the output terminal of the optical sensing panel by a second current during the readout period.

17. The readout integrated circuit of claim 16, wherein the second charging circuit comprises:
a second current source, controlled by a second voltage to generate the second current.

18. The readout integrated circuit of claim 17, wherein the second current source comprises a first terminal, a second terminal and a control terminal, and the second current is transmitted from the first terminal of the second current source to the second terminal of the second current source, wherein the first terminal of the second current source is coupled to the output terminal of the optical sensing panel, the second terminal of the second current source is coupled to a reference voltage, and the control terminal of the second current source is coupled to the second voltage.

19. The readout integrated circuit of claim 16, wherein
a pre-discharging circuit, coupled to the output terminal of the optical sensing panel and configured to discharge the output terminal of the optical sensing panel to an initial voltage during a pre-discharging period, wherein the pre-discharging period is earlier than the readout period.

20. The readout integrated circuit of claim 19, wherein the pre-discharging circuit comprises:
a third switch element, controlled by a third voltage and comprising a first terminal, a second terminal and a control terminal, wherein the first terminal of the third switch element is coupled to the output terminal of the optical sensing panel, the second terminal of the third switch element is coupled to the second charging circuit, and the control terminal of the third switch element is coupled to the third voltage.

21. The readout integrated circuit of claim 19, wherein the second charging circuit and the pre-discharging circuit are disposed in the readout integrated circuit.

22. The readout integrated circuit of claim 19, wherein the second charging circuit and the pre-discharging circuit are disposed in a display panel where the sensor array is embedded.

23. The readout integrated circuit of claim 16, wherein the first current is larger than or equal to the second current.

24. The readout integrated circuit of claim 19, wherein the output terminal of the optical sensing panel is pre-discharged to a voltage level which is approximate to a lowest input voltage of an analog-to-digital converter during the pre-discharging period.

25. A readout integrated circuit, configured to read out sensing signals from an optical sensing panel comprising a sensor array for fingerprint sensing, the readout integrated circuit comprising:
   a plurality of input terminals, configured to be coupled to a plurality of output terminals of the optical sensing panel;
   a first charging/discharging circuit, coupled to one of the plurality of input terminals and configured to selectively charge or discharge an output terminal included in the plurality of output terminals of the optical sensing panel by a first current during a readout period, wherein the readout integrated circuit reads out a voltage of the output terminal of the optical sensing panel as a sensing signal; and
   a control circuit, coupled to the first charging/discharging circuit and configured to output at least one control signal to control an operating period which is a time length that the first charging/discharging circuit charges or discharges the output terminal of the optical sensing panel by the first current,
   wherein the at least one control signal comprises a first control signal and a second control signal, and the first charging/discharging circuit comprises:
      a first switch element, controlled by the first control signal; and
      a second switch element, controlled by the second control signal, wherein a phase of the second control signal and a phase of the first control signal are inverted with each other.

26. The readout integrated circuit of claim 25, wherein a first terminal of the first switch element is coupled to a first voltage, a second terminal of the first switch element is coupled to a control terminal of the first current source, and a control terminal of the first switch element is coupled to the first control signal; and
   wherein a first terminal of the second switch element is coupled to the control terminal of the first current source, a second terminal of the second switch element is coupled to a reference voltage, and a control terminal of the second switch element is coupled to the second control signal.

27. The readout integrated circuit of claim 25, wherein when the first switch element is conducted, the second switch element is not conducted; and
   when the second switch element is conducted, the first switch element is not conducted.

28. A readout integrated circuit, configured to read out sensing signals from an optical sensing panel comprising a sensor array for fingerprint sensing, the readout integrated circuit comprising:
   a plurality of input terminals, configured to be coupled to a plurality of output terminals of the optical sensing panel;
   a first charging/discharging circuit, coupled to one of the plurality of input terminals and configured to selectively charge or discharge an output terminal included in the plurality of output terminals of the optical sensing panel by a first current during a readout period, wherein the readout integrated circuit reads out a voltage of the output terminal of the optical sensing panel as a sensing signal; and
   a control circuit, coupled to the first charging/discharging circuit and configured to output a control signal to control an operating period which is a time length that the first charging/discharging circuit charges or discharges the output terminal of the optical sensing panel by the first current,
   wherein the first charging/discharging circuit comprises:
      a first current source;
      a first switch element, controlled by the control signal, wherein a first terminal of the first switch element is coupled to a first voltage, a second terminal of the first switch element is coupled to a control terminal of the first current source, and a control terminal of the first switch element is coupled to the control signal; and
      a diode element, comprising an anode terminal and a cathode terminal, wherein the anode terminal of the diode element is coupled to the output terminal of the optical sensing panel, and the cathode terminal of the diode element is coupled to a first terminal of the first switch element.

* * * * *